(12) United States Patent
Yoon

(10) Patent No.: US 7,550,830 B2
(45) Date of Patent: Jun. 23, 2009

(54) STACKED SEMICONDUCTOR PACKAGE HAVING FAN-OUT STRUCTURE THROUGH WIRE BONDING

(75) Inventor: Tae-Sung Yoon, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/954,707

(22) Filed: Dec. 12, 2007

(65) Prior Publication Data
US 2008/0088018 A1    Apr. 17, 2008

Related U.S. Application Data

(62) Division of application No. 11/279,344, filed on Apr. 11, 2006, now Pat. No. 7,327,032.

(30) Foreign Application Priority Data
Apr. 13, 2005    (KR) .................... 10-2005-0030736

(51) Int. Cl.
  *H01L 23/48*    (2006.01)
  *H01L 23/52*    (2006.01)
  *H01L 23/28*    (2006.01)

(52) U.S. Cl. .............. 257/678; 257/E23.141; 257/E23.069; 257/E23.101; 257/E23.178; 257/E25.023; 257/737; 257/778; 257/734; 257/673; 257/698; 257/E23.021; 257/668; 257/E23.125; 257/E23.124; 257/E23.004; 257/773; 257/700; 257/701; 257/703

(58) Field of Classification Search ................. 257/678, 257/E23.141, E23.069, 738, E23.101, E23.178, 257/E25.023, 737, E23.021, E23.125, E23.124, 257/E23.004, 778, 734, 673, 698, 668, 773, 257/609, 700, 701, 703
See application file for complete search history.

(56) References Cited

U.S. PATENT DOCUMENTS

| | | | |
|---|---|---|---|
| 5,888,837 A | 3/1999 | Fillion et al. | |
| 6,172,423 B1 * | 1/2001 | Lee | 257/780 |
| 6,219,254 B1 | 4/2001 | Akerling et al. | |
| 6,294,403 B1 | 9/2001 | Joshi | |
| 6,300,685 B1 | 10/2001 | Hasegawa et al. | |

(Continued)

FOREIGN PATENT DOCUMENTS

KR    2000-0074142    12/2000

(Continued)

OTHER PUBLICATIONS

English language abstract of Korean Publication No. 2000-0074142.

(Continued)

*Primary Examiner*—Alexander O Williams
(74) *Attorney, Agent, or Firm*—Marger, Johnson & McCollom, P.C.

(57) ABSTRACT

Provided is a semiconductor package accomplishing a fan-out structure through wire bonding in which a pad of a semiconductor chip is connected to a printed circuit board through wire bonding. A semiconductor package can be produced without a molding process and can be easily stacked on another semiconductor package while the appearance cracks and the warpage defects can be prevented.

20 Claims, 14 Drawing Sheets

U.S. PATENT DOCUMENTS

| | | | |
|---|---|---|---|
| 6,313,522 B1 | 11/2001 | Akram et al. | |
| 6,380,615 B1 | 4/2002 | Park et al. | |
| 6,650,015 B2 | 11/2003 | Chen et al. | |
| 6,992,384 B2 | 1/2006 | Joshi | |
| 7,002,245 B2 | 2/2006 | Huang et al. | |
| 7,217,994 B2* | 5/2007 | Zhu et al. | 257/686 |
| 7,326,907 B2* | 2/2008 | Shibayama et al. | 250/214.1 |
| 7,344,969 B2* | 3/2008 | Tan et al. | 438/612 |
| 2002/0048906 A1 | 4/2002 | Sakai et al. | |
| 2003/0133274 A1 | 7/2003 | Chen et al. | |
| 2003/0143777 A1 | 7/2003 | Camenforte et al. | |
| 2005/0104196 A1 | 5/2005 | Kashiwazaki | |
| 2005/0167819 A1 | 8/2005 | Schott et al. | |
| 2005/0224968 A1 | 10/2005 | Ho | |
| 2005/0258537 A1 | 11/2005 | Huang et al. | |
| 2005/0280141 A1 | 12/2005 | Zhang | |
| 2006/0065972 A1 | 3/2006 | Khan et al. | |
| 2006/0138674 A1 | 6/2006 | Huang et al. | |
| 2007/0181989 A1* | 8/2007 | Corisis et al. | 257/686 |
| 2008/0136007 A1* | 6/2008 | Kim et al. | 257/686 |

FOREIGN PATENT DOCUMENTS

| | | |
|---|---|---|
| KR | 2001-0046832 | 6/2001 |
| KR | 2004-0012028 | 2/2004 |

OTHER PUBLICATIONS

English language abstract of Korean Publication No. 2001-0046832.
English language abstract of Korean Publication No. 2004-0012028.

* cited by examiner

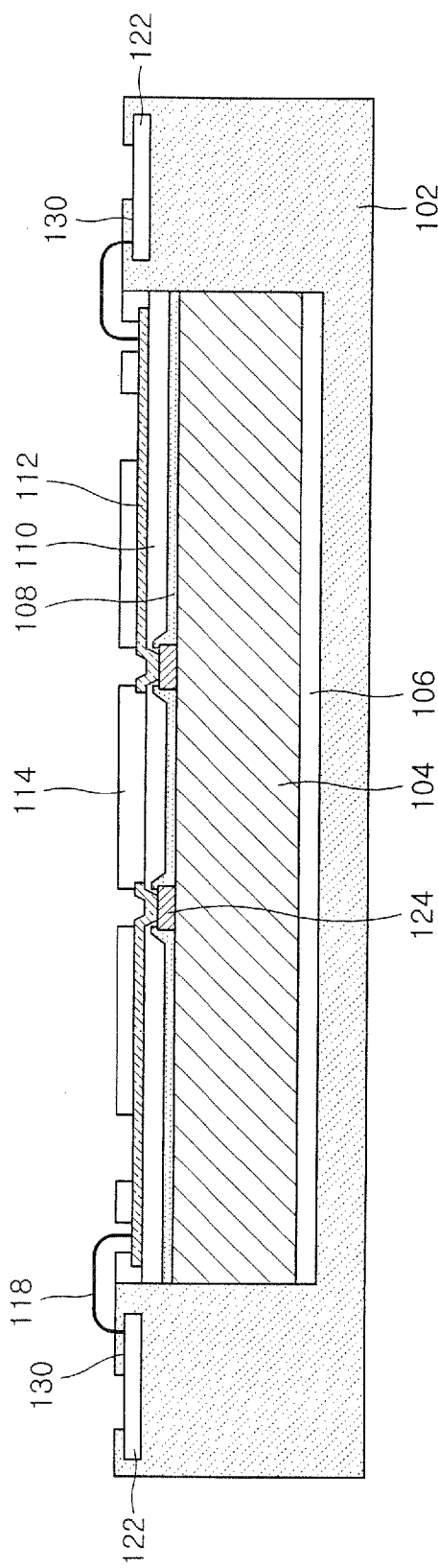
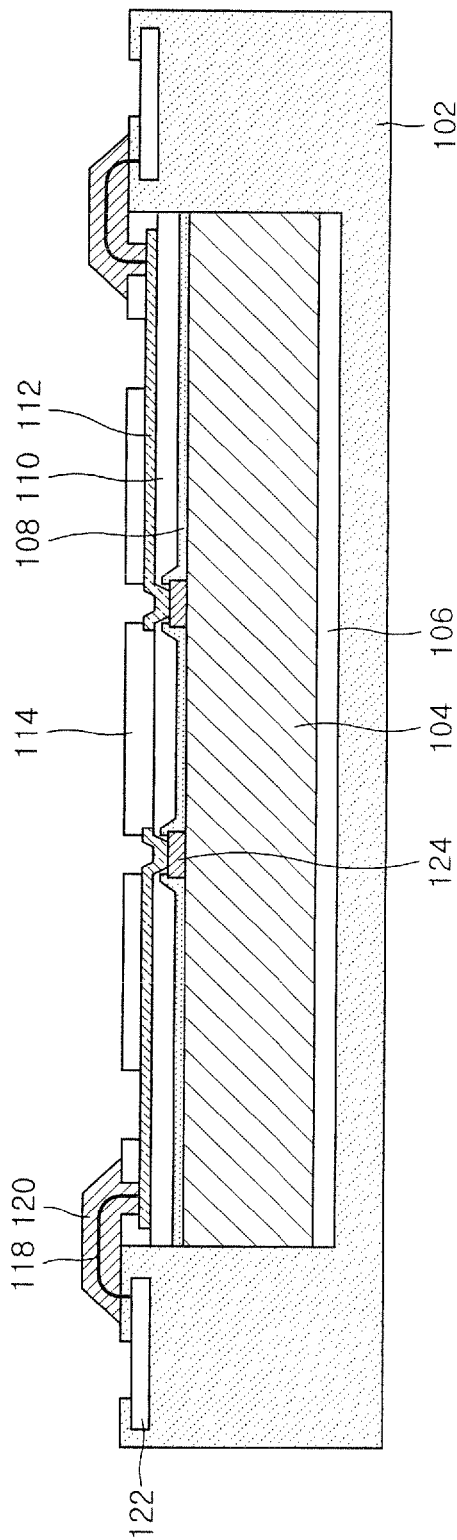

STACKED SEMICONDUCTOR PACKAGE HAVING FAN-OUT STRUCTURE THROUGH WIRE BONDING

CROSS-REFERENCE TO RELATED PATENT APPLICATION

This application is a Divisional of U.S. Ser. No. 11/279,344, filed on Apr. 11, 2006, now issued as U.S. Pat. No. 7,327,032, which claims priority from Korean Patent Application No. 10-2005-0030736, filed on Apr. 13, 2005, all of which are hereby incorporated by reference in their entirety.

BACKGROUND OF THE INVENTION

1. Field of the Invention

The present invention relates to a semiconductor package, and more particularly, to a semiconductor package using solder balls as external connection terminals.

2. Description of the Related Art

Manufacturing a semiconductor package typically includes a series of operations coupling external connection terminals to a semiconductor chip and sealing the semiconductor chip as a package to protect, for example, against external impact.

Recently, as the electronics industry has grown, certain aspects of semiconductor packages have been developed to obtain miniaturization, lightness and reduction in manufacturing cost. Moreover, as semiconductor packages have been applied to digital image devices, MP3 players, mobile phones, massive storage units, etc., various kinds of semiconductor packages have been introduced. For example, a ball grid array (BGA) package and a wafer level chip scale package (WLCSP) are known forms of semiconductor packages.

FIGS. 1 and 2 are cross-sectional views of a conventional BGA package 20 (FIG. 1) and a conventional WLCSP 40 (FIG. 2).

Referring to FIG. 1, in a conventional BGA package, a semiconductor chip 24 is mounted on a printed circuit board 22 having printed circuit patterns such as a bond finger 26 and a solder ball pad 36. The bond finger 26 on the printed circuit board 22 is connected to a bond pad 28 on the semiconductor chip 24 by a wire 30. The bond fingers 26 electrically couple by way of the printed circuit board 22 to the solder ball pads 36. Thereafter, a molding process using sealing resin 32 guards or encapsulates the semiconductor chip 24 and the wire 30. Lastly, by attaching a solder ball 34 to the solder ball pad 36 on the bottom of the printed circuit board 22, the typical BGA package 20 results.

However, the BGA package 20 has drawbacks relating to the molding process. More particularly, the molding process imposes a minimum thickness limitation because of potential warpage defects. Moreover, it is known to be very difficult to fabricate a BGA package stack, e.g., a stack of BGA packages each having the same or similar structure.

In the case of the general WLCSP 40 shown in FIG. 2, a first insulation layer 48 and a metallic bond pad redistribution pattern 50 are applied to the surface of a semiconductor chip 42 having a bond pad 44 and a passivation layer 46 also formed thereon in a wafer manufacturing process. After a second insulation layer 52 is applied to the surface where the bond pad redistribution pattern 50 is formed, solder ball pads are exposed through a photolithographic process, and solder balls 54 are attached to the solder ball pads.

A minimum thickness of a semiconductor package formed using the WLCSP 40 also exists due to a warpage defect constraint. Also, as with the BGA package 20 (FIG. 1), it is not feasible to fabricate a stacked semiconductor package by using, e.g., stacking, multiple ones of the WLCSP 40. Furthermore, since the semiconductor chip 42 is externally exposed, there is a high risk of cracking, e.g., due to the handling of the semiconductor package.

Presently, a significant concern regarding the WLCSP 40 is the interval between the solder balls 54, e.g., the interval cannot be further decreased due to the international standards established by the Joint Electron Device Engineering Council (JEDEC), even though the size of semiconductor chips has been gradually decreasing through ever greater integration obtained in manufacturing of semiconductor chips. As a result, for example, when the size of a semiconductor chip 42 reduces to two-thirds its original size, one or two solder balls 54 among six solder balls 54 (FIG. 2) cannot be attached to the semiconductor chip 42 according to known BGA packaging methods. In other words, when the solder balls 54 are attached within the footprint of the semiconductor chip 42 as shown in the WLCSP 40, known as a fan-in structure, the density of solder balls 54 cannot match the density of bond pads 44 when the chip 42 reduces to a given size.

SUMMARY

Embodiments of the present invention provide a semiconductor package capable of manufacture without a molding process, stacking to obtain high integration, and having a fan-out structure accomplished through wire bonding. According to certain embodiments of the present invention, a semiconductor package includes a semiconductor chip having a first surface and a second surface, the first surface including a plurality of first solder ball pads and a plurality of first bond fingers. The package also includes a printed circuit board having a first surface and a second surface, the first surface including a plurality of second solder ball pads, a plurality of second bond fingers, and a chip recess to receive therein the semiconductor chip. The first bond fingers and the second bond fingers are electrically connectable to establish a fan-out structure. In some embodiments of the present invention, establishing additional solder ball pads on the second surface of the printed circuit board allows stacking of multiple semiconductor packages. In some embodiments of the present invention, establishing a heat transmitter on the second surface of the printed circuit board allows heat dissipation from the semiconductor chip.

BRIEF DESCRIPTION OF THE DRAWINGS

The above and other features and advantages of the present invention will become more apparent by describing in detail exemplary embodiments thereof with reference to the attached drawings in which:

FIGS. 18 through 22 are cross-sectional views illustrating a method of manufacturing the semiconductor package illustrated in FIG. 3.

DETAILED DESCRIPTION

This disclosure will now be described more fully with reference to the accompanying drawings in which exemplary embodiments of the invention are shown. The invention should not be, however, construed as limited to the embodiments set forth herein; rather, these embodiments are provided to make this disclosure thorough and complete to those skilled in the art.

Figure 1:
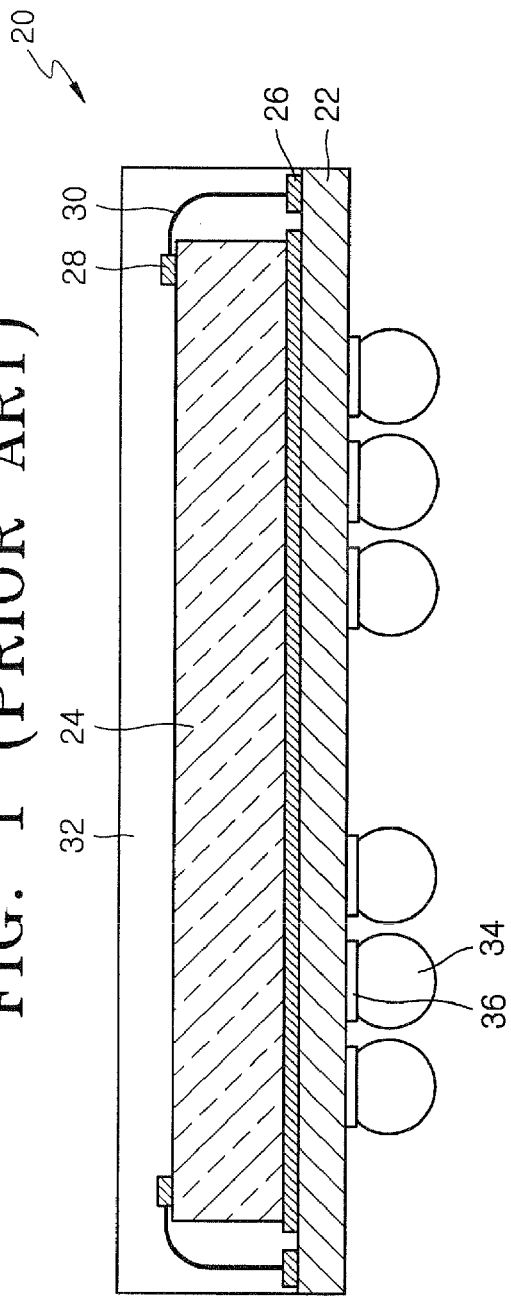
FIG. 1 (Prior Art) is a cross-sectional view of a conventional ball grid array (BGA) package.
Figure 2:
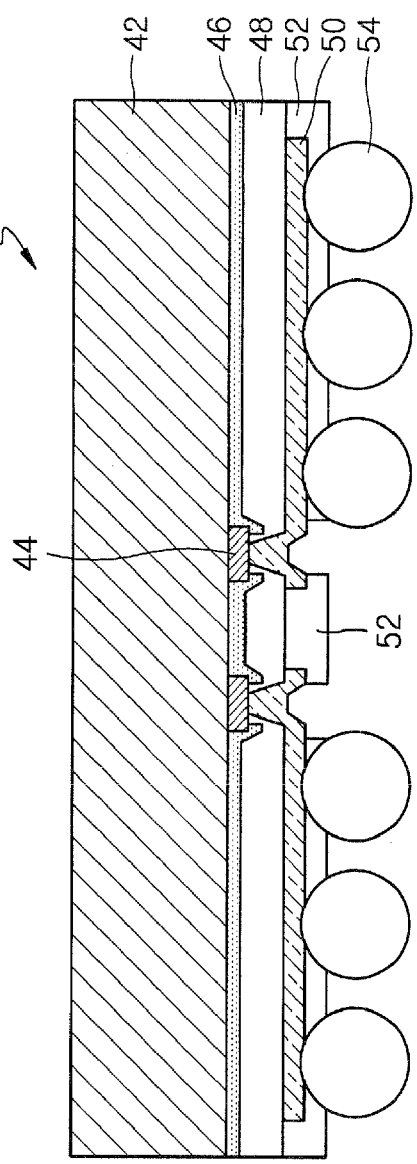
FIG. 2 (Prior Art) is a cross-sectional view of a conventional wafer level chip scale package (WLCSP)
Figure 3:
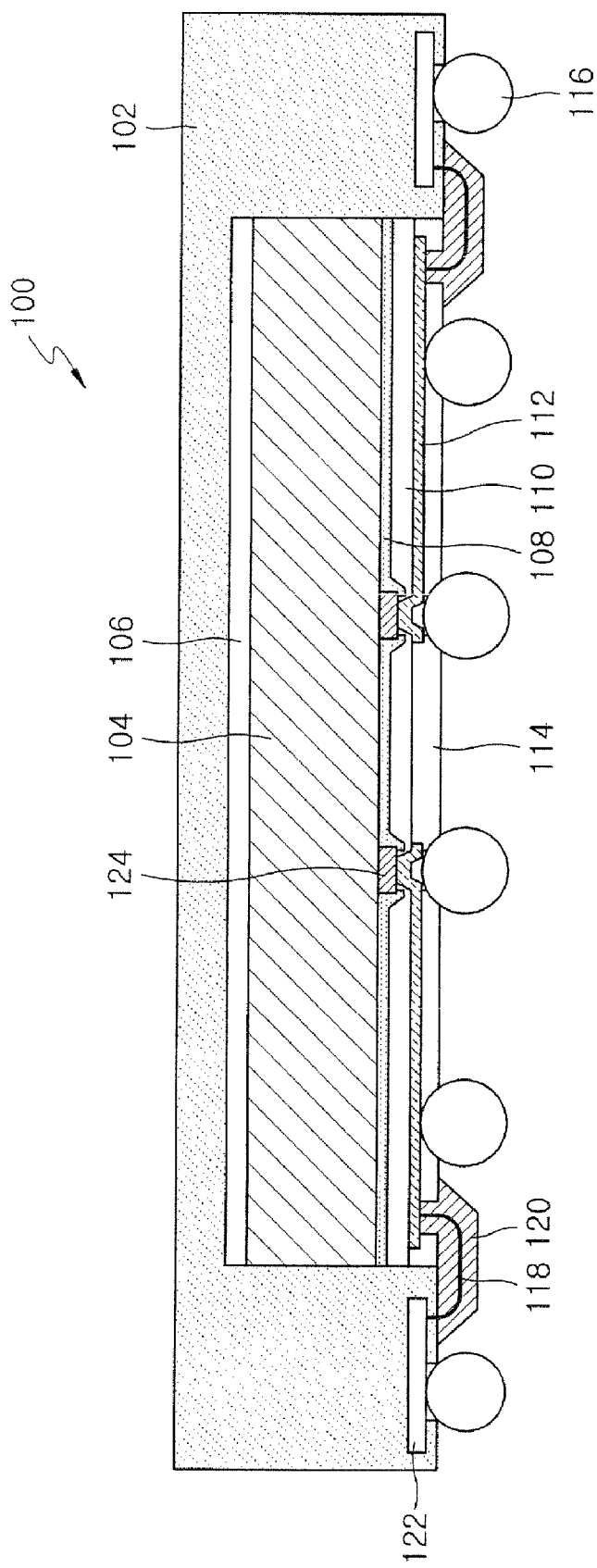
FIG. 3 is a cross-sectional view of a semiconductor package according to a first embodiment of the present invention.

FIG. 3 is a cross-sectional view of a semiconductor package 100 according to a first embodiment of the present invention employing a fan-out structure, e.g., with solder balls attached outside the footprint of a semiconductor chip. In FIG. 3, the semiconductor package 100 accomplishes a fan-out structure through wire bonding and, in this particular embodiment, includes a mono-layer printed circuit board 102 as a base frame. The printed circuit board 102 may be a multi-layer structure. Generally, the package 100 locates a plurality of first solder ball pads 126 (FIG. 4) and a plurality of first bond fingers 128 (FIG. 4) within the footprint of, e.g., as a portion of, the semiconductor chip 104. A plurality of second solder ball pads 122 and second bond fingers 130 (see FIG. 6), however, are formed along the printed circuit board 102 (see FIG. 6). Also, a chip recess, in which the semiconductor chip 104 can be inserted, is formed in the printed circuit board 102, e.g., near the second bond fingers 130.

The first solder ball pads 126 (see FIG. 4) and the first bond fingers 128 (see FIG. 4) are connected to bond pads 124 through a bond pad redistribution pattern 112 disposed over the semiconductor chip 104. An adhesive 106, e.g., such as an adhesive tape, may be located at the bottom surface of the chip recess in the printed circuit board 102. In other words, the semiconductor chip 104 may be mounted such that the surface without solder ball pads 126 faces the bottom of the chip recess. Also, a passivation layer 108, a first insulation layer 110, and a second insulation layer 114 are sequentially formed on the semiconductor chip 104.

Furthermore, the semiconductor package 100 includes wires 118 connecting the first bond fingers 128 of the semiconductor chip 104 and the second bond fingers 130 on the printed circuit board 102. The semiconductor package 100 also includes an encapsulant 120 sealing and protecting the wires 118. The semiconductor package 100 also includes solder balls 116 attached to the first solder ball pads 126 and to the second solder ball pads 122. Collectively, the solder balls 116 extend beyond the footprint of the semiconductor chip 104 according to a fan-out arrangement.

Figure 4:
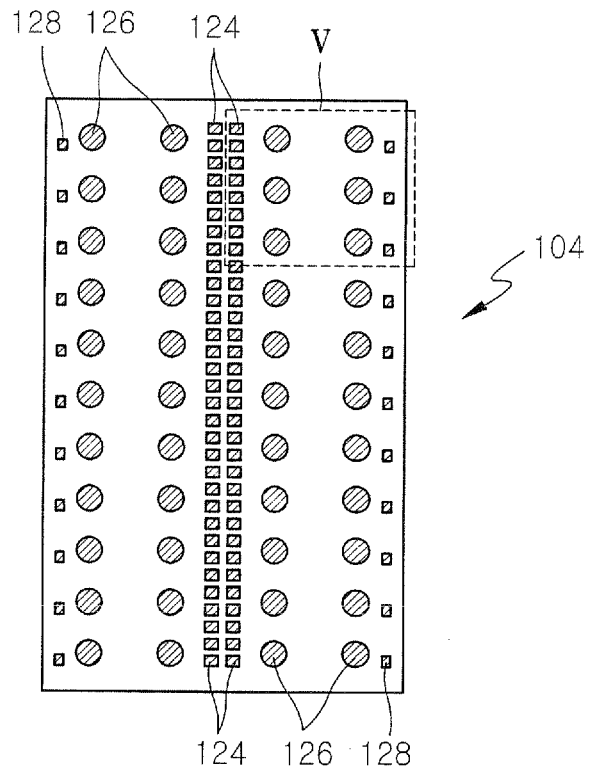
FIG. 4 is a plan view of a semiconductor chip of FIG. 3.
Figure 5:
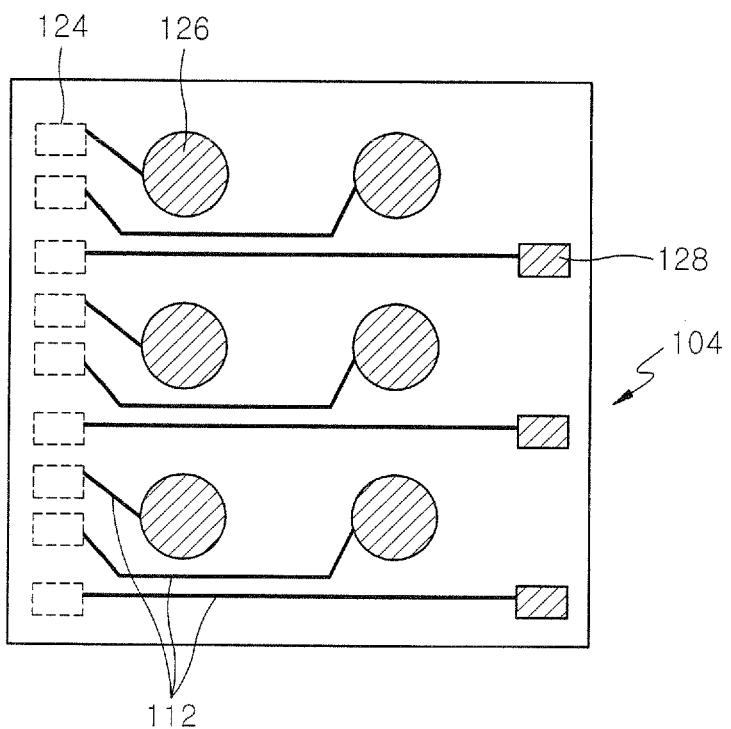
FIG. 5 is an enlarged plan view illustrating wire connections on the portion designated "V" in FIG. 4.

FIG. 4 is a plan view of the semiconductor chip in FIG. 3, and FIG. 5 is an enlarged plan view illustrating wire connections of a portion designated "V" in FIG. 4.

Referring to FIGS. 4 and 5, the semiconductor chip 104 may be a WLCSP in that the manufacturing of the first solder ball pads 126 is performed using wafer fabricating operations. Accordingly, the bond pads 124, previously manufactured on the semiconductor chip 104, are connected to the first solder ball pads 126 and to the first bond fingers 128 through the bond pad redistribution pattern, e.g., by way of conductor patterns 112 in FIG. 5.

The semiconductor chip 104 thereby includes both the first bond fingers 128 as well as the first solder ball pads 126. In accordance with some embodiments of the present invention, as the semiconductor chip 104 reduces in size, e.g., due to greater integration, additional solder ball pads, e.g., solder ball pads 122, can be formed outside the footprint of the semiconductor chip 104.

Figure 6:
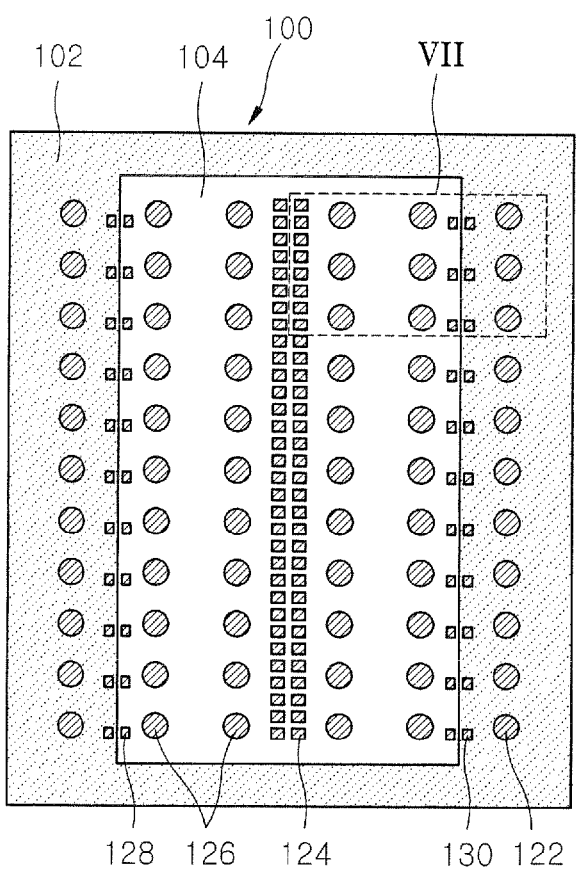
FIG. 6 is a bottom plan view of the semiconductor package of FIG. 3 after mounting the semiconductor chip.
Figure 7:
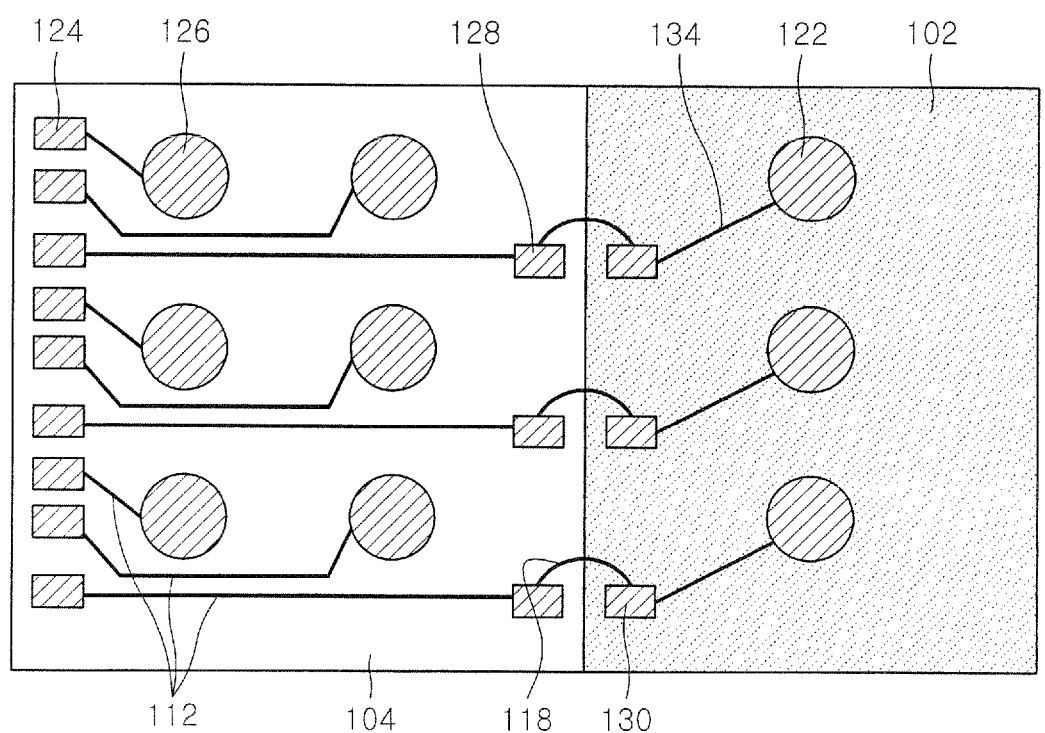
FIG. 7 is an enlarged plan view illustrating wire connections of a portion designated "VII" in FIG. 6.

FIG. 6 is a bottom plan view of the semiconductor package of FIG. 3 after mounting the semiconductor chip, and FIG. 7 is an enlarged plan view illustrating wire connections of a portion designated "VII" in FIG. 6.

Referring to FIGS. 6 and 7, the second bond fingers 130 and the second solder ball pads 122 are deposited along sides of the printed circuit board 102. The semiconductor package 100 includes the bonding wires 118 connecting the first bond fingers 128 of the semiconductor chip 104 to the second bond fingers 130 of the printed circuit board 102 as shown in FIG. 7.

Accordingly, the bond pads 124 not connected to the first solder ball pads 126 in a fan-in structure, e.g., due to greater integration of the semiconductor chip 104, are connected to the second solder ball pads 122 in a fan-out structure. In detail, the bond pads 124 of the semiconductor chip 104 not connected to the first solder ball pads 126 are connected to the first bond fingers 128, e.g., through a bond pad redistribution pattern 112. In addition, the first bond fingers 128 are connected to the second bond fingers 130 by the bonding wires 118, and then to the second solder ball pads 122 by a wire pattern 134. Accordingly, in this particular embodiment the number of the second solder ball pads 122 can be equal to the number of each of the first and the second bond fingers 128 and 130, respectively.

Figure 8:
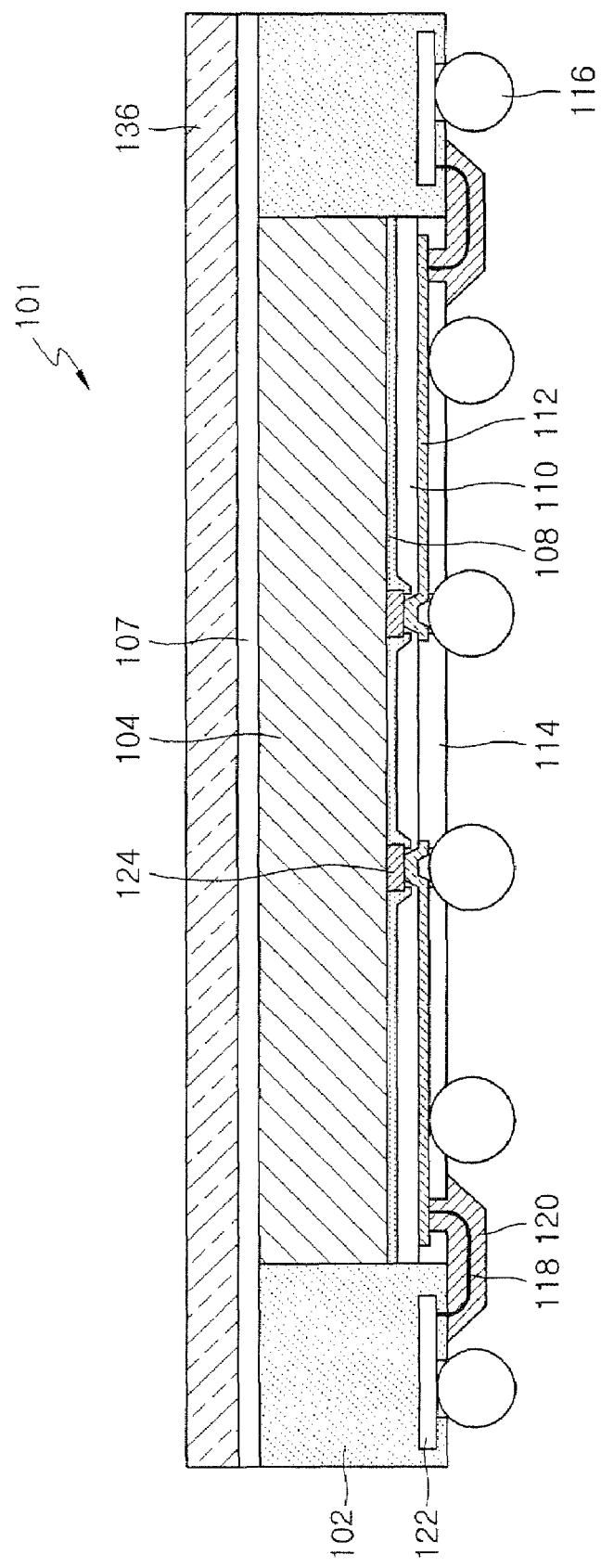
FIG. 8 is a cross-sectional view illustrating an exemplary modification of the semiconductor package of FIG. 3.

FIG. 8 is a cross-sectional view illustrating an exemplary modification of the semiconductor package 100.

In the first embodiment, the semiconductor chip 104 and the bottom of the chip recess in the printed circuit board 102 are attached by, for example, the adhesive tape 106. In a semiconductor package 101 according to the modification of FIG. 8, however, the chip recess is open at the second surface of the printed circuit board 102 and an adhesive thermal interface material (TIM) 107 is employed as the adhesive, e.g., contacting a bottom surface of the semiconductor chip 104 as well as portions of the second surface of the printed circuit board 102. In this case, the printed circuit board 102 may additionally include a heat transmitter 136, e.g., made of a material with high thermal conductivity such as copper or aluminum, also coupled to the TIM 107 and facing the bottom surface of the semiconductor chip 104, e.g., opposite to the surface on which the solder ball pads 126 are formed. Accordingly, even though a large amount of heat is generated when the semiconductor chip 104 operates at high speed, heat dissipates outward by establishing a heat transfer passage from the bottom surface of the semiconductor chip 104 through the TIM to the heat transmitter 136.

Figure 9:
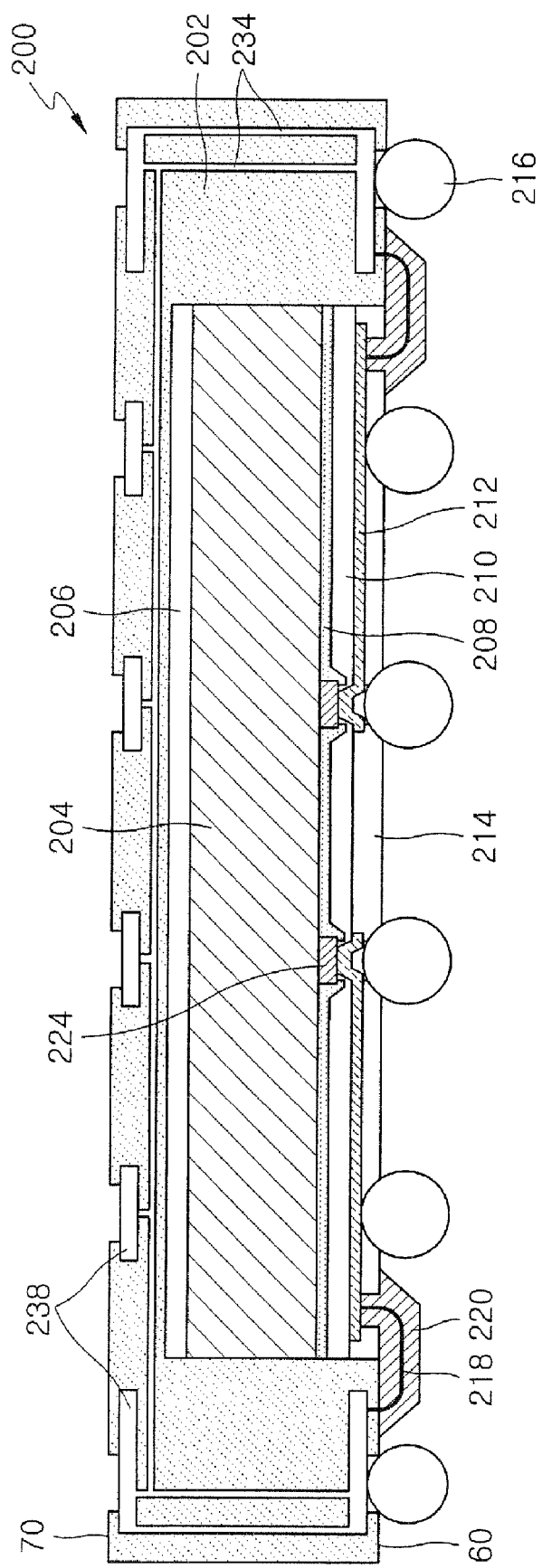
FIG. 9 is a cross-sectional view of a semiconductor package according to a second embodiment of the present invention.

FIG. 9 is a cross-sectional view of a semiconductor package 200 according to a second embodiment of the present invention. In FIG. 9, the semiconductor package 200 accomplishes a fan-out structure through wire bonding, but uses a multi-layered printed circuit board 202 as a base frame. A plurality of second bond fingers 230 (see FIG. 12) and second solder ball pads 222 (see FIG. 12) are formed along both sides of a first surface 60 of the multi-layered printed circuit board 202. A chip recess is formed in the multi-layered printed circuit board 202 and a semiconductor chip 204 can be inserted in the recess.

The semiconductor chip 204 is mounted at the bottom of the chip recess of the printed circuit board 202 with an adhesive, e.g., an adhesive tape 206. The semiconductor chip 204 may be a WLCSP having first solder ball pads 226 (see FIG. 10) and first bond fingers 228 (see FIG. 10) formed thereon in a wafer-level manufacturing process.

In addition, the semiconductor package 200 includes a plurality of third solder ball pads 238. The third solder ball pads 238 connect to the first and second solder ball pads 226 and 222, respectively, through wires 234 in the multi-layered printed circuit board 202 and extending to a second surface 70 thereof. Furthermore, the semiconductor package 200 also includes wires 218 connecting first bond fingers 228 (see FIG. 10) and the second bond fingers 230. An encapsulant 220 seals the wires 218. Solder balls 216 are attachable to the first and second solder ball pads 226 and 222, respectively.

The multi-layered printed circuit board 202 is used as the base frame and the third solder ball pads 238 are included as well as the first and second solder ball pads 226 and 222, respectively. Thus, it is possible to fabricate a stacked semiconductor package using the semiconductor package 200.

Figure 10:
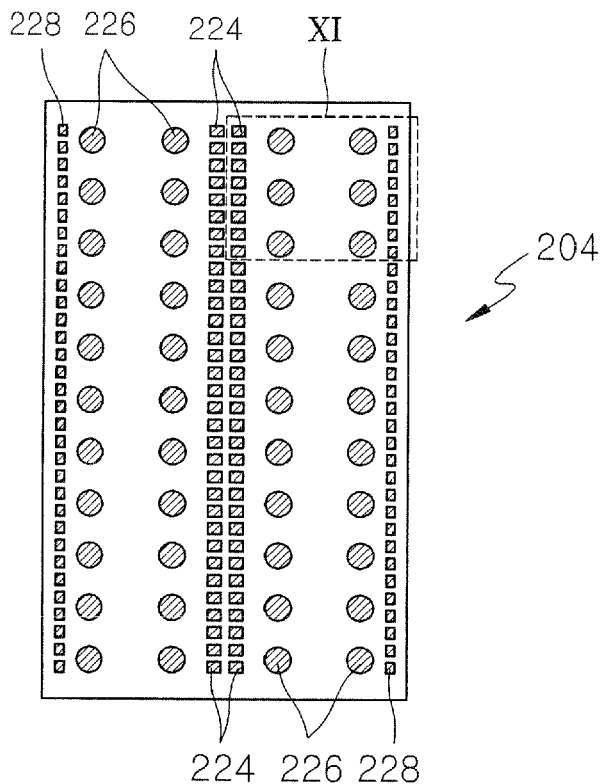
FIG. 10 is a plan view of a semiconductor chip of FIG. 9.
Figure 11:
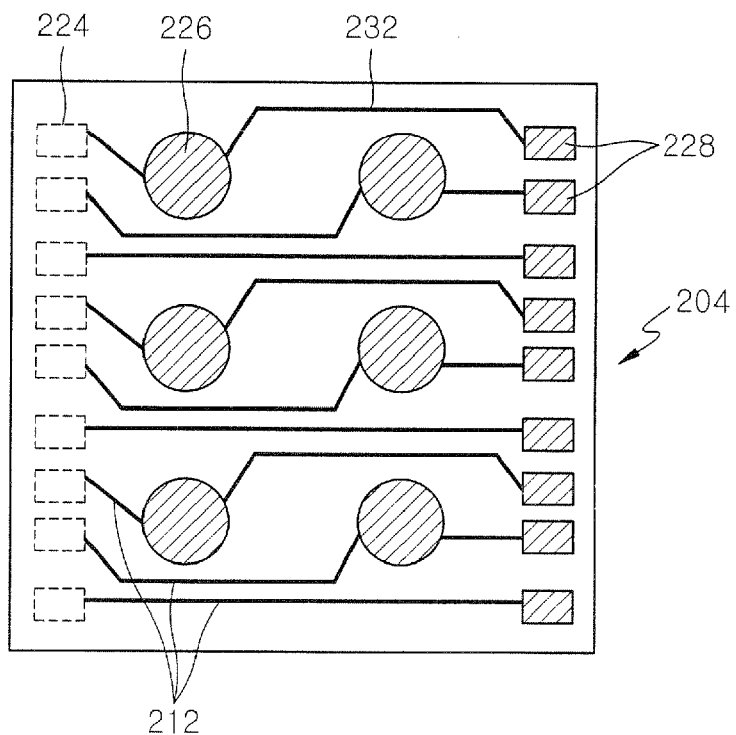
FIG. 11 is an enlarged plan view illustrating wire connections of a portion designated "XI" in FIG. 10.

FIG. 10 is a plan view of the semiconductor chip 204 in FIG. 9, and FIG. 11 is an enlarged plan view illustrating wire connections in a portion designated "XI" in FIG. 10.

Referring to FIGS. 10 and 11, each of a plurality of bond pads 224 is connected to one of the first solder ball pads 226 or first bond fingers 228 through a bond pad redistribution pattern 212, as shown in FIG. 11. In the first embodiment described above (see FIGS. 4 and 5), the bond pad 124 is connected to the first bond finger 128, not the first solder ball pad 126. However, in the second embodiment, the bond pads 224 are respectively connected to the first bond fingers 228. This is because the first and second solder ball pads 226 and 222, respectively, extend to the third solder ball pads 238 through the wires 234 in the multi-layered printed circuit board 202, as shown in FIG. 9.

Figure 12:
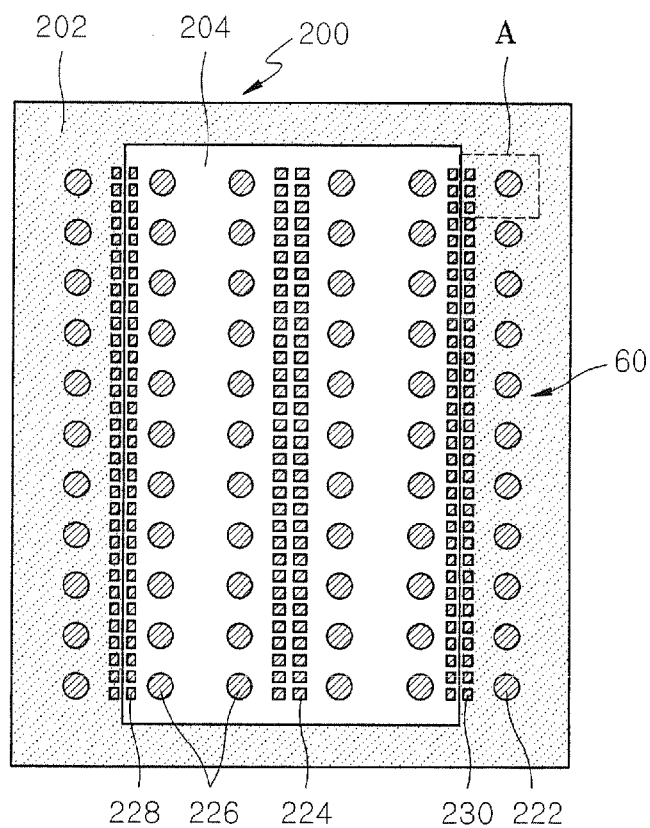
FIG. 12 is a bottom plan view of the semiconductor package after mounting the semiconductor chip in FIG. 9.
Figure 13:
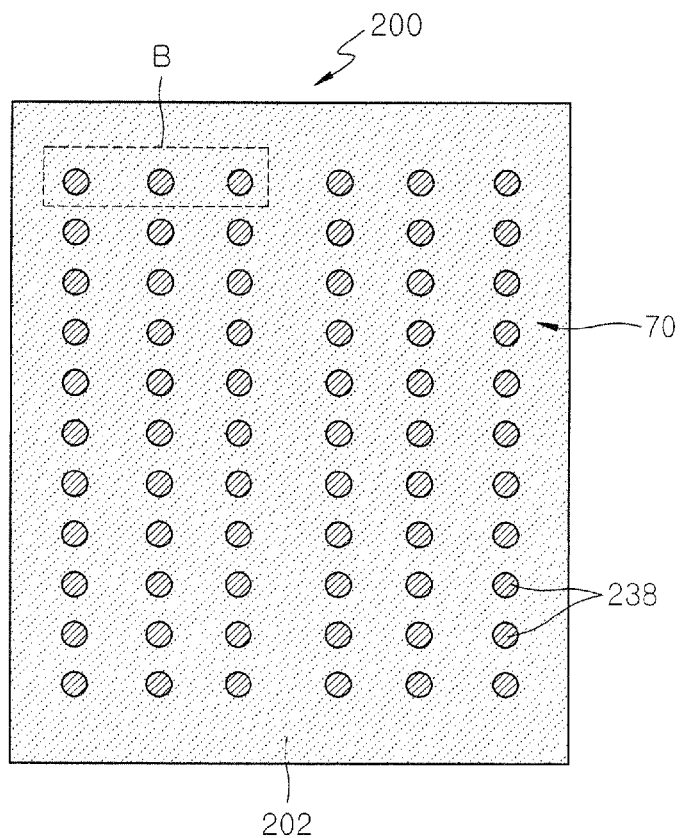
FIG. 13 is a plan view of the semiconductor package of FIG. 9.

FIG. 12 is a bottom plan view of the semiconductor package of FIG. 9 after mounting the semiconductor chip 204, and FIG. 13 is a top plan view of the semiconductor package of FIG. 9.

Referring to FIGS. 12 and 13, the second bond fingers 230 and second solder ball pads 222 are individually formed along sides of the first surface 60 of the multi-layered printed circuit board 202. Here, the number of each of the first and second bond fingers 228 and 230 is equal to the sum of the numbers of the first and second solder ball pads 226 and 222, respectively. In other words, compared with the first embodiment described above, in the second embodiment, the number of each of the first and second bond fingers 228 and 230 is relatively increased.

The bond pads 224 are electrically connected to the first bond fingers 228 directly or through the first solder ball pads 226 in the semiconductor package 200. The first bond fingers 228 are electrically connected to the second bond fingers 230 on the printed circuit board or the second solder ball pad 222 on the printed circuit board through the second bond fingers 230 (see FIG. 14), and to the third solder ball pads 238 on the second surface 70 of the multi-layered printed circuit board 202 (see FIG. 14) through the wires 234. Thus, the respective positions of the third solder ball pads 238 correspond to those of the first or second solder ball pads 226 or 222.

Figure 14:
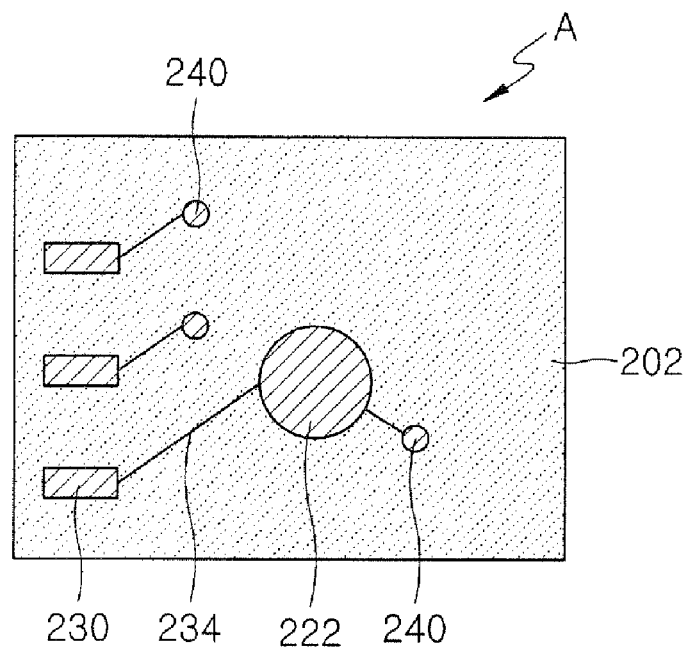
FIG. 14 is an enlarged plan view illustrating wire connections of a portion designated "A" in FIG. 12.
Figure 15:
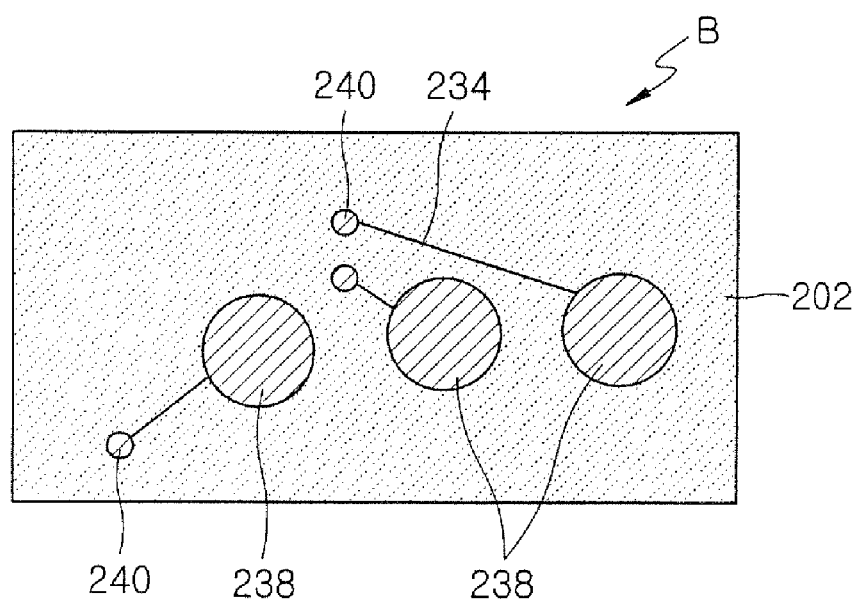
FIG. 15 is an enlarged plan view illustrating wire connections of a portion designated "B" in FIG. 13.

FIGS. 14 and 15 are enlarged plan views illustrating wire connections of a portion designated "A" in FIG. 12 and a portion designated "B" in FIG. 13, respectively.

Referring to FIGS. 14 and 15, the first bond fingers 228 are respectively electrically connected to the second bond fingers 230 or to the second solder ball pads 222 through the second bond fingers 230 on the first surface ("A" in FIG. 14) of the multi-layered printed circuit board. The electric connections extend to the second surface of the printed circuit board 202 through holes 240. The holes 240 in the second surface ("B" in FIG. 15) allow the second solder ball pads 222 to be respectively electrically connected to the third solder bal pads 238 through a wire.

Figure 16:
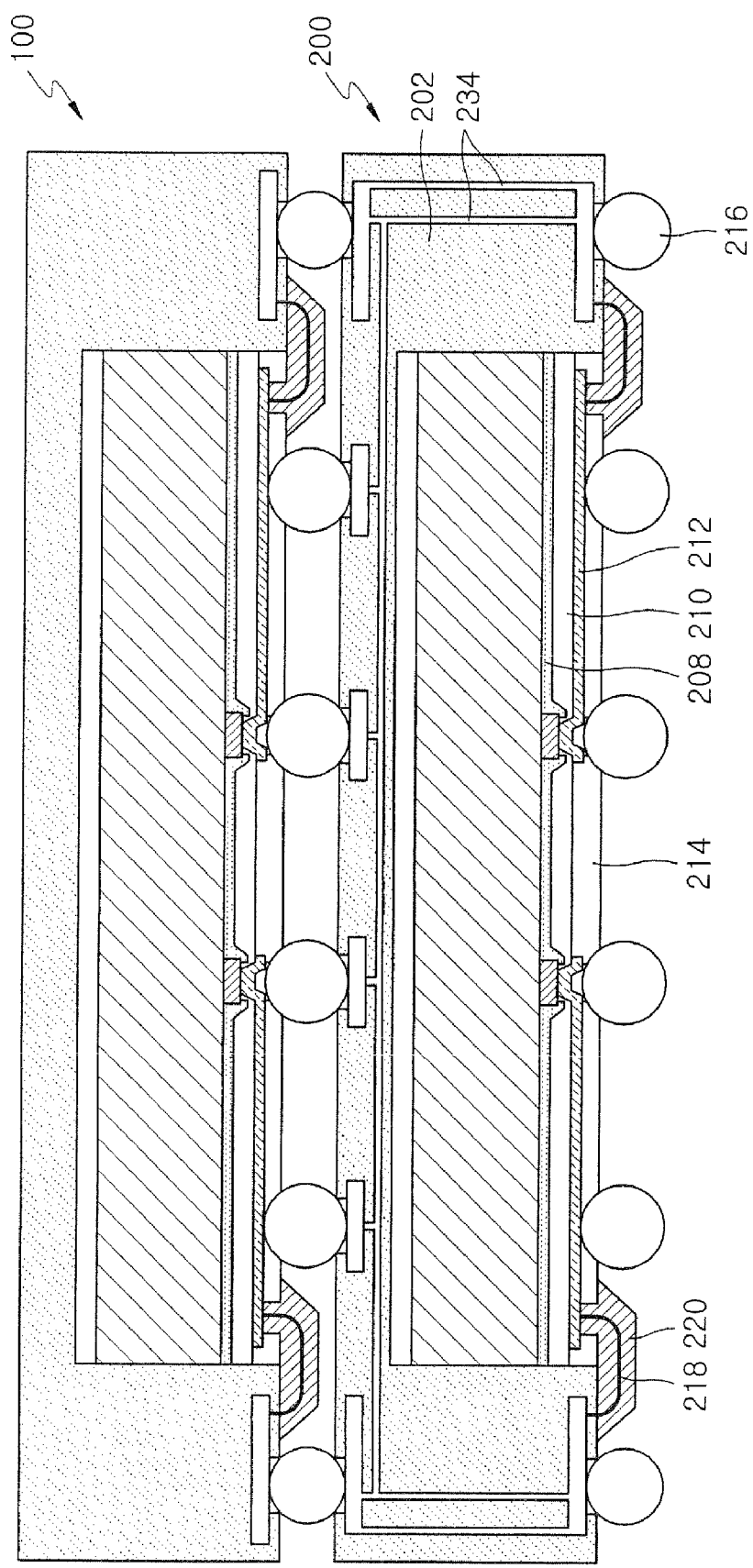
FIG. 16 is a cross-sectional view of a stacked semiconductor package including the semiconductor packages of FIGS. 3 and 9 according to an embodiment of the present invention.

FIG. 16 is a cross-sectional view showing a stacked semiconductor package including the semiconductor packages 100 and 200 according to another embodiment of the present invention.

Referring to FIG. 16, the semiconductor package 100 is stacked on the semiconductor package 200 with electric connections through third solder ball pads 238. Therefore, when the semiconductor package is a memory device, for example, it can realize high-density as a system in package (SIP) with a bit modification.

Figure 17:
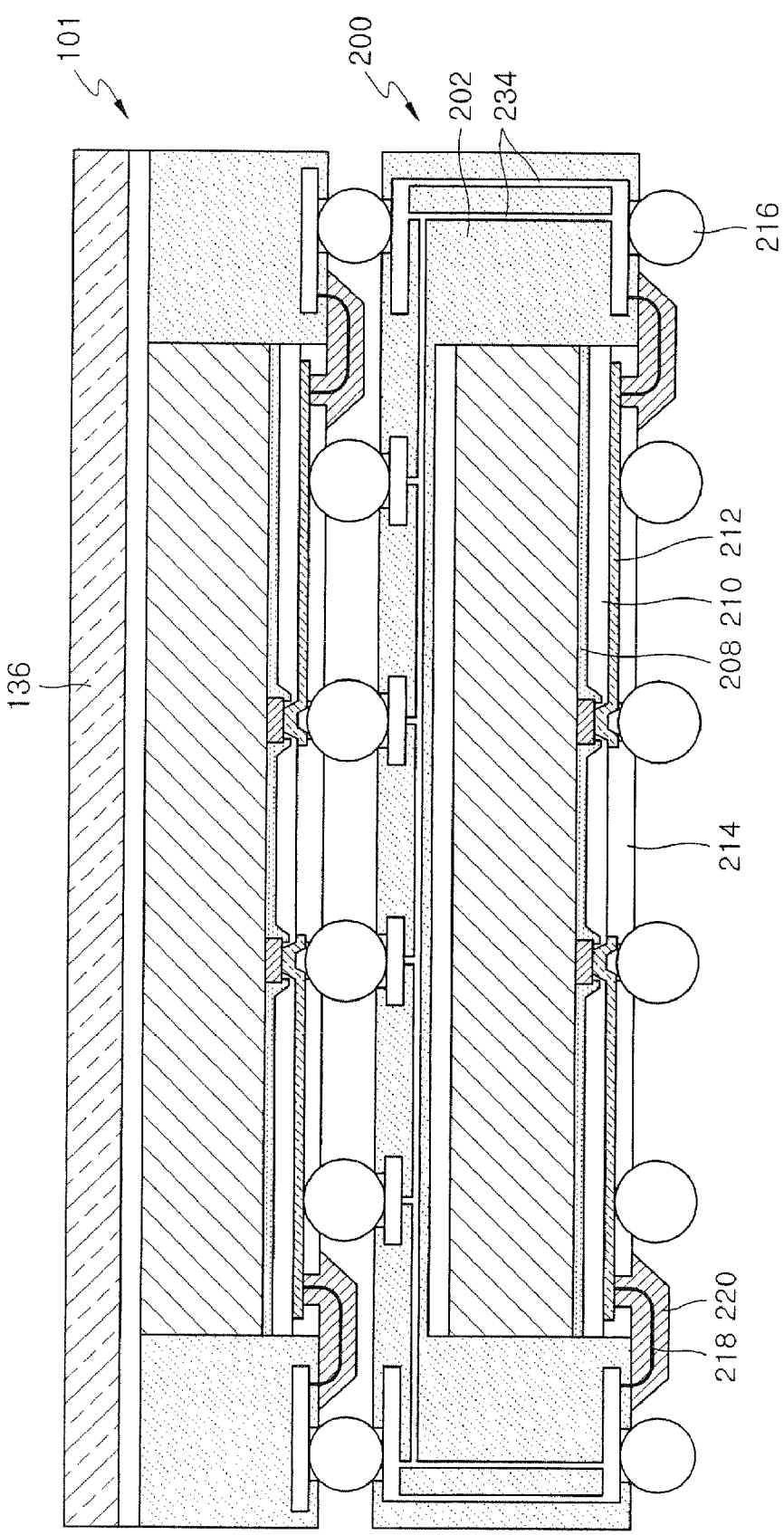
FIG. 17 is a cross-sectional view of a stacked semiconductor package including the semiconductor packages of FIGS. 8 and 9 according to an embodiment of the present invention.

FIG. 17 is a cross-sectional view of a stacked semiconductor package including the semiconductor packages 101 and 200 according to yet another embodiment of the present invention.

Referring to FIG. 17, the semiconductor package 200 is stacked under the semiconductor package 101. Accordingly, the stacked semiconductor package of FIG. 17 has an advantage of being able to efficiently dissipate heat.

FIGS. 18 through 22 are sequential cross-sectional views illustrating a method of manufacturing the semiconductor package 100.

Figure 18:
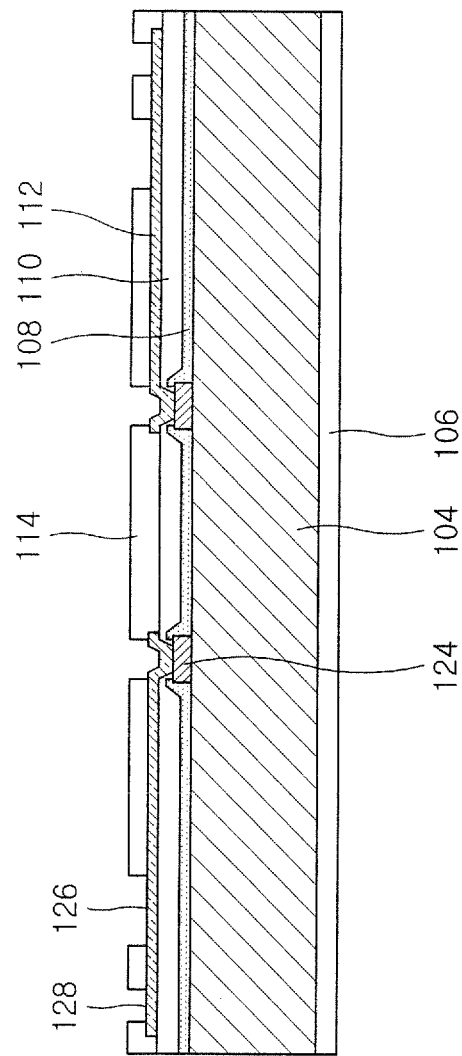
Figure 19:
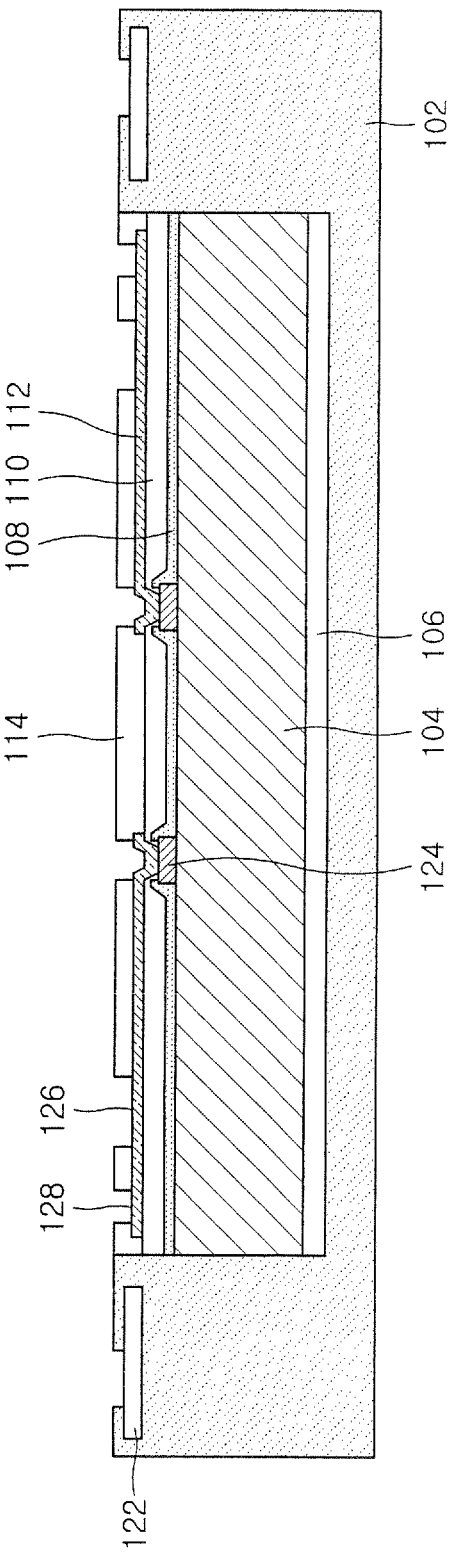
Figure 22:
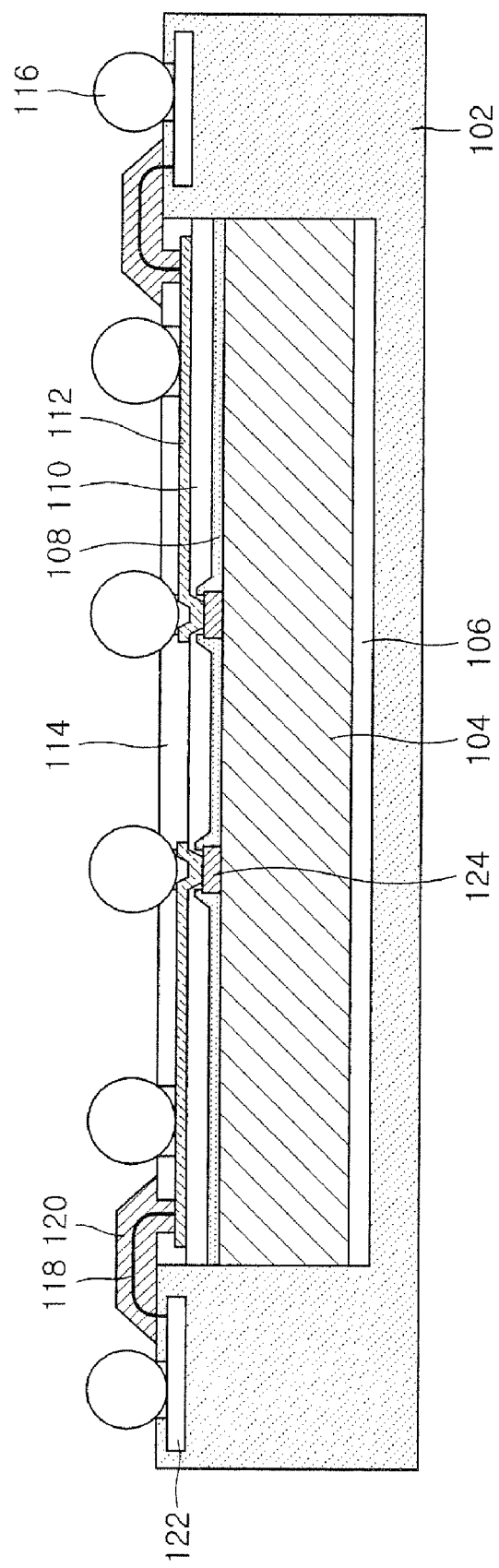

Referring to FIG. 18, first, the WLCSP-type semiconductor chip 104 is prepared. A portion of the bond pad redistribution pattern 112 uncovered by a second insulation layer in the semiconductor package 104 forms a plurality of the first solder ball pads 126 and the first bond fingers 128. In addition, referring to FIG. 19, the adhesive tape 106 is attached to the bottom of the semiconductor chip 104. Thereafter, the semiconductor chip 104 is mounted into a chin recess of the monolayer printed circuit board 102 with the adhesive 106 providing attachment. A plurality of the second bond fingers 130 and the second solder ball pads 122 are individually formed along both sides of the monolayer printed circuit board 102.

Then, referring to FIGS. 20 and 21, the first bond fingers 128 are connected to the second bond fingers 130 by the wires 118 during a wire bonding process, and then the wires 118 are sealed by an encapsulant 120. Lastly, referring to FIG. 22, the solder balls 116 are attached to the first and second solder ball pads 126 and 122, respectively.

The method of manufacturing the semiconductor package 200 is similar to that of the semiconductor package 100 in view of an overall packaging process despite there being some differences in the structures of the printed circuit board 202 and the semiconductor chip 204, differences a person of skill in the relevant art will understand. Accordingly further explanation thereof is omitted.

As will be appreciated, while certain particular electrical connections are shown between various elements to form particular circuits, e.g., connections between various chip pads, bonding pads, solder ball pads, printed circuit board elements and the like, it will be understood that many various configurations may be obtained by variation in such connections beyond those particular connections shown herein. Accordingly the present invention shall not be necessarily limited to any particular set of electrical connections shown herein.

According to some embodiments of the present invention, a solder ball can be mounted in a fan-out structure through wire bonding in spite of a relatively smaller sized WLCSP-type semiconductor chip. Due to the use of a sufficiently thick printed circuit board, the appearance of cracks and warp defects can be prevented and a molding process can be omitted. The additional use of a heat transmitter is helpful for dissipating heat when the semiconductor chip operates at high speed. In addition, an effective stacked semiconductor package can be realized to fabricate a system in package (SIP) or to enhance the degree of integration of a semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A stacked semiconductor package comprising:
    a first semiconductor package including:
        a first semiconductor chip having a first surface and a second surface;
        a plurality of redistribution patterns overlying the first surface of the semiconductor chip;
        a plurality of bond pads and a plurality of first solder ball pads formed on the first surface of the semiconductor chip, wherein a first group of the plurality of bond pads are respectively electrically connected to the plurality of first solder ball pads via a first group of the plurality of redistribution patterns;
        an insulating layer overlying the plurality of redistribution patterns, the insulating layer including openings to respectively expose portions of a second group of the redistribution patterns to define a plurality of first bond fingers;
        a multi-layered printed circuit board having a first surface and a second surface, the printed circuit board including a chip recess defined therein to receive the semiconductor chip;
        a plurality of second solder ball pads and a plurality of second bond fingers formed on the first surface of the printed circuit board; and
        a plurality of third solder ball pads formed on the second surface of the printed circuit board,
        wherein the first bond fingers and the second bond fingers are electrically connectable to each other
    a plurality of first solder balls formed on the third solder ball pads; and
    a second semiconductor package stacked on the first semiconductor package, the second semiconductor package electrically connected to the first semiconductor package through the first solder balls.

2. The stacked package of claim 1, wherein a number of each of the first plurality of bond fingers and the plurality of second bond fingers corresponds to a sum of a number of the plurality of first solder ball pads and the plurality of second solder ball pads.

3. The stacked package of claim 1, wherein the number of the plurality of third solder ball pads corresponds to a sum of the plurality of first solder ball pads and the plurality of second solder ball pads.

4. The stacked package of claim 1, further comprising an adhesive attached to the first semiconductor chip and to a bottom of the chip recess.

5. The stacked package of claim 1, wherein the respective positions of the third solder ball pads on the second surface of the multi-layered printed circuit board correspond to the collective positions of the plurality of first solder ball pads and the plurality of second solder ball pads.

6. The stacked package of claim 1, wherein the plurality of first solder ball pads is generally co-planar with the plurality of second solder ball pads.

7. The stacked package of claim 1, wherein the second bond fingers are located adjacent to the periphery of the chip recess.

8. The stacked package of claim 1, further comprising a plurality of wires to connect the first bond fingers and the second bond fingers.

9. The stacked package of claim 8, further comprising an encapsulant to seal the plurality of wires.

10. The stacked package of claim 1, further comprising a plurality of second solder balls attachable to the first and second solder ball pads.

11. The stacked package of claim 1, wherein the plurality of first bond fingers are electrically connected to a corresponding plurality of bond pads via a portion of the plurality of redistribution patterns not electrically connecting the first solder ball pads to a corresponding plurality of bond pads.

12. The stacked package of claim 1, wherein the printed circuit board comprises an insulator material selected from a group consisting of FR4 and BT resin.

13. The stacked package of claim 4, wherein the adhesive comprises an adhesive tape attached to a bottom of the chip recess and to the second surface of the first semiconductor chip.

14. The stacked package of claim 4, wherein the adhesive comprises a thermal interface material.

15. The stacked package of claim 14, further comprising a heat transmitter attachable to the thermal interface material on a surface thereof opposite that attachable to the semiconductor chip.

16. The stacked package of claim 1, wherein the second semiconductor package comprises:
    a second semiconductor chip having a first surface and a second surface;
    a plurality of redistribution patterns overlying the first surface of the semiconductor chip;
    a plurality of bond pads and a plurality of fourth solder ball pads formed on the first surface of the second semiconductor chip, wherein a first group of the plurality of bond pads are respectively electrically connected to the plurality of fourth solder ball pads via a first group of the plurality of redistribution patterns;
    an insulating layer overlying the plurality of redistribution patterns, the insulating layer including openings to respectively expose portions of a second group of the redistribution patterns to define a plurality of first bond fingers; and a printed circuit board having a first surface and a second surface, the printed circuit board including a chip recess defined therein to receive the second semiconductor chip;

a plurality of fifth solder ball pads and a plurality of second bond fingers formed on the first surface of the printed circuit board, wherein the first bond fingers and the second bond fingers are electrically connectable to each other.

17. The stacked package of claim 16, further comprising an adhesive attachable to a second surface of the second semiconductor chip.

18. The stacked package of claim 17, wherein the adhesive a thermal interface material.

19. The stacked package of claim 18, further comprising a heat transmitter attachable to the thermal interface material.

20. The stacked package of claim 16, wherein the second semiconductor package further comprises:

a plurality of wires to connect the first bond fingers and the second bond fingers of the second semiconductor package; and an encapsulant to seal the plurality of wires connecting the first bond fingers and the second bond fingers of the second semiconductor package.

* * * * *

UNITED STATES PATENT AND TRADEMARK OFFICE
CERTIFICATE OF CORRECTION

PATENT NO. : 7,550,830 B2  Page 1 of 1
APPLICATION NO. : 11/954707
DATED : June 23, 2009
INVENTOR(S) : Tae-Sung Yoon It is certified that error appears in the above-identified patent and that said Letters Patent is hereby corrected as shown below:

Column 6, line 20, the word "bal" should read -- ball --;
Column 6, line 50, the word "chin" should read -- chip --.

Signed and Sealed this

Fifteenth Day of September, 2009

David J. Kappos
*Director of the United States Patent and Trademark Office*